(12) United States Patent
Choi et al.

(10) Patent No.: US 7,504,867 B2
(45) Date of Patent: Mar. 17, 2009

(54) BUS HOLDERS HAVING WIDE INPUT AND OUTPUT VOLTAGE RANGES AND TOLERANT INPUT/OUTPUT BUFFERS USING THE SAME

(75) Inventors: Jae-Bum Choi, Hwaseong-si (KR); Eon-Guk Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 11/341,142

(22) Filed: Jan. 27, 2006

(65) Prior Publication Data
US 2006/0181315 A1 Aug. 17, 2006

(30) Foreign Application Priority Data
Feb. 12, 2005 (KR) .................. 10-2005-0011705

(51) Int. Cl.
*H03B 1/00* (2006.01)
*H03K 3/00* (2006.01)
(52) U.S. Cl. .................. 327/108; 327/219; 327/333
(58) Field of Classification Search ......... 327/108–113, 327/321, 327, 328, 379, 382, 384, 389, 391, 327/219, 333
See application file for complete search history.

(56) References Cited

U.S. PATENT DOCUMENTS

| 4,988,893 A * | 1/1991 | Bonneau et al. ............. 327/211 |
| 5,467,038 A * | 11/1995 | Motley et al. ............... 327/185 |
| 5,699,315 A | 12/1997 | Ko |
| 5,793,592 A * | 8/1998 | Adams et al. ................. 361/90 |
| 5,828,233 A * | 10/1998 | Nguyen et al. ............... 326/86 |
| 5,886,541 A * | 3/1999 | Asato .......................... 326/93 |
| 5,914,844 A | 6/1999 | Lutley et al. |
| 5,973,530 A | 10/1999 | Morris et al. |
| 6,094,086 A * | 7/2000 | Chow ......................... 327/396 |
| 6,236,236 B1 | 5/2001 | Chen |
| 6,563,360 B1 * | 5/2003 | Bodenstab .................. 327/313 |
| 6,784,715 B2 * | 8/2004 | Campbell .................... 327/295 |
| 7,005,354 B2 * | 2/2006 | Pan et al. .................... 438/286 |
| 2005/0218933 A1 * | 10/2005 | Linam et al. .................. 326/83 |
| 2006/0055646 A1 * | 3/2006 | Vincent ........................ 345/87 |

OTHER PUBLICATIONS

Pasternak, J.H.; Salama, C.A.T., "Differential pass-transistor logic," Circuits and Devices Magazine, IEEE , vol. 9, No. 4, pp. 23-28, Jul. 1993.*

* cited by examiner

*Primary Examiner*—Kenneth B Wells
*Assistant Examiner*—John W Poos
(74) *Attorney, Agent, or Firm*—Myers Bigel Sibley & Sajovec, P.A.

(57) ABSTRACT

A bus holder includes a first inverter, a second inverter and a pass switch. The first inverter is coupled between a first power supply voltage node and a second power supply voltage node, and receives an input signal via an input terminal to output a first output signal having an inverted phase with respect to the input signal. The second inverter is coupled between the first power supply voltage node and the second power supply voltage node, and inverts the first output signal to output a second output signal, having an inverted phase with respect to the first output signal, to an output terminal. The pass switch is coupled between the input terminal and the output terminal, and outputs a signal having a level of a control voltage to the input terminal, in response to the control voltage. Accordingly, a tolerant input/output buffer may stably maintain an input signal level when a bus is floated.

12 Claims, 6 Drawing Sheets

100

BUS HOLDERS HAVING WIDE INPUT AND OUTPUT VOLTAGE RANGES AND TOLERANT INPUT/OUTPUT BUFFERS USING THE SAME

CROSS REFERENCE TO RELATED APPLICATION

This application claims the benefit under 35 USC §119 of Korean Patent Application No. 10-2005-0011705, filed on Feb. 12, 2005, the disclosure of which is hereby incorporated herein by reference in its entirety as if set forth fully herein.

FIELD OF THE INVENTION

This invention relates to logic signal buses, and more particularly to bus holders for logic signal buses, and input/output buffers using the same.

BACKGROUND OF THE INVENTION

In input/output circuits, a bus holder has been used to maintain the previous voltage state (or logic state) on a logic signal bus until a new input signal is input, for example via a pad, when the bus/pad is floated. The bus holder often includes two inverters that are connected to each other. The voltage levels of an input/output signal may be diversified as diverse application products are released. Therefore, the input/output circuit also may be designed to enable diverse voltage levels to be processed. Accordingly, the input/output circuit may include the tolerant input/output buffer using a pass transistor and a bus holder, and can be used for application products that treat a wide range of input/output voltages.

FIG. 1 is a circuit diagram illustrating a conventional tolerant input/output buffer, and FIG. 2 is a circuit diagram illustrating another conventional tolerant input/output buffer.

Hereinafter, an operation of a bus holder used for the conventional tolerant input/output buffer and the tolerant input/output circuit will be explained with reference to FIGS. 1 and 2.

Referring to FIG. 1, the tolerant input/output buffer 100 includes a PAD that receives an external signal, an electrostatic discharge protection circuit 110, a pass transistor 120, a first inverter 130, a second inverter 140, a pass switch 150, and a buffer 160.

The PAD receives and outputs a signal from/to an external source. As used herein "PAD" means any input/output signal carrying line, whether or not in the shape of a pad. When an over-voltage caused by static electricity is applied toward a core logic (connected at Y) while a signal is received through the PAD, the electrostatic discharge protection circuit 110 supplies an additional passage for the over-voltage and protects the core logic by preventing the over-voltage from being transferred to the core logic. When the voltage level of the input signal received through the PAD is higher than an operation voltage range of the first inverter 130 or the buffer 160, the pass transistor 120 lowers the input voltage level and supplies the input signal having the lowered voltage level to the first inverter 130 and the buffer 160. A bus holder includes the first inverter 130, the second inverter 140, and the pass switch 150, in order to maintain the voltage of a node B1. The buffer 160 transfers the input signal received through the PAD and the pass transistor 120 to the core logic. A first power supply voltage of the electrostatic discharge protection circuit 110, the pass transistor 120, the first inverter 130, the second inverter 140, the buffer 160, and other circuits is, for example, 1.8 volts.

Hereinafter, when an input signal of 3.3 volts and the input signal of 1.8 volts are applied to the PAD, an operation of the tolerant input buffer 100 will be explained.

First, when the input signal of 3.3 volts is received through the PAD, the voltage at a connection node A1 between the PAD and the pass transistor 120 becomes 5 volts, and the voltage at a connection node B1 between the pass transistor 120 and the first inverter 130 becomes 1.0 volt.

Since the pass transistor 120 is an n-type MOS transistor, the node B1 outputs the voltage, which is lower than the power supply voltage (e.g., 1.8 volts) that is coupled to a gate of the pass transistor 120 by a threshold voltage Vth. In other words, when the voltage received through the PAD is higher than the power supply voltage of 1.8 volts, (1.8 volts—threshold voltage Vth) is output.

Therefore, even when the voltage of the input signal is much higher, the first inverter 130 and the buffer 160 are provided with the lowered input signal (i.e., 1.8 volts—threshold voltage Vth).

Consequentially, the voltage of the node B1 becomes 1.0 volt, and 1.0 volt is input to the buffer 160. Then, the lowered input signal is transferred to the core logic via the buffer 160. At this time, the first inverter 130, an input terminal of which is connected to the node B1, produces an output signal of 0 volts, and the second inverter 140 produces an output signal of 1.8 volts.

At the same time, the voltage of 1.0 volt is output to a node C1 via an n-type MOS transistor MN3 of the pass switch 150 that is connected to the node B1. However, since the node C1 is also connected with the output signal of the second inverter, the voltage of the node C1 is immediately increased to 1.8 volts.

Then, 1.8 volts of the voltage of the node C1 is transferred to node B1 by the PMOS transistor MP3 of the pass switch 150 so that the voltage of node B1 is raised to 1.8 volts. In this state, when the input signal of the PAD is removed, the PAD may become a floating state, and thus a signal having a voltage level of the floating state may be applied to the core logic.

However, when the bus holder is provided as described in FIG. 1, the node C1 is maintained at 1.8 volts and the node B1 is maintained at 1.8 volts by the pass switch 150. Thereby, the input state of the buffer 160 is maintained at a previous state of 1.8 volts.

When the input signal is 1.8 volts, only the voltage of the node A1 is different compared with the case in which the input signal is 3.3 volts. After passing through the pass transistor 120, the node B1 becomes 1.0 volt. Accordingly, the same operation as the case in which the input signal is 3.3 volts is performed.

The above-described tolerant input/output buffer 100 can operate regardless of the input voltage range and enables the bus holder to stably maintain a previous logic state when the PAD is floated. However since an initial voltage (e.g., 1.0 volt) of the node B1 is lower than the power supply voltage of 1.8 volts, and is close to the threshold voltage, namely the power supply voltage/2 (i.e., 0.9 volt) of the buffer 160, characteristics of a tolerant input cell may be deteriorated.

Particularly, it may be difficult to obtain a design margin for a Schmidt trigger's input cell when the buffer 160 is a Schmidt trigger. Since the Schmidt trigger has a hysteresis characteristic, the Schmidt trigger can stably operate when the input voltage is much higher than the threshold voltage (e.g., the power supply voltage/2) of the Schmidt trigger. In the tolerant input/output buffer of FIG. 1, the difference between the input voltage (i.e., 1.0 volt) of the Schmidt trigger, i.e., the buffer 160 and the threshold voltage (i.e., 0.9 volt)

of the Schmidt trigger may be small (i.e., 0.1 volt). Accordingly, the Schmidt trigger may not operate normally.

Therefore, a circuit that enables the input voltage level of the buffer 160 to be higher than the threshold voltage (the power supply voltage/2) of the Schmidt trigger may be desired. An alternative conventional device is shown in FIG. 2.

FIG. 2 is a circuit diagram illustrating a conventional tolerant input/output buffer different from FIG. 1.

The tolerant input/output buffer may include a PAD, a static protection circuit 210, a first inverter 230, a second inverter 240, a pass switch 250, and a buffer 260. The tolerant input/output buffer of FIG. 2 is different from the tolerant input/output buffer of FIG. 1 in that the pass transistor 120, which lowers the voltage level of the input signal, is not used and the pass switch 250 includes only an n-type MOS transistor.

Since the pass transistor is not used so as to maintain the input voltage level of the buffer 260 at a high level, the input signal that passes through the PAD is not lowered and is transferred to a node A2.

Accordingly, since the input voltage of the buffer 260 can become higher than the threshold voltage of the Schmidt trigger, the possibility for an abnormal operation of the buffer 260 may be reduced.

When the input signal is 1.8 volts, and the pass switch 250 includes an n-type MOS transistor MN3 and a p-type MOS transistor MP3, the node A2 initially maintains 1.8 volts, and a node C2 is also maintained at 1.8 volts by the first inverter 230 and the second inverter 240.

When the PAD is floated, a node C2 can be maintained at 1.8 volts by an output the second inverter 240, and the node A2 can be maintained at 1.8 volts through the p-type MOS transistor of the pass switch 250.

However, when the input signal is 3.3 volts, the node A2 initially applies 3.3 volts. The voltage of the node A2 enables the node C2 to be maintained at 3.3 volts by the p-type MOS transistor MP3 of the pass switch 250. This may create a problem that the p-type MOS transistor of the second inverter is turned on, and thus inverse current may flow.

In order to solve the potential problem, the pass switch 250 includes only the n-type MOS transistor MN3 without using the p-type MOS transistor MP3. However, when the pass switch 250 is constituted only of the n-type MOS transistor without using the pass transistor as shown in FIG. 2, there also may be a problem in that the voltage of the node A2 is lowered after a predetermined time from the start of the floating of the PAD.

It is desirable for the level of the input voltage to be maintained. However, since the pass switch 250 is constituted only of the n-type MOS transistor MN3 and the node C2 outputs the voltage of 1.0 volt (i.e., the power supply voltage of 1.8 volts—the threshold voltage of the n-type MOS transistor MN3), the voltage of the node C2 may be lowered and may not maintain the input voltage level.

SUMMARY OF THE INVENTION

Some embodiments of the present invention provide a bus holder, which enables a level of an input signal to be maintained stably to a level of a control voltage.

Some embodiments of the present invention also provide a tolerant input/output buffer, which may stably maintain a level of an input signal level when a PAD is floated.

In some embodiments, a bus holder includes a first inverter, coupled between a first power supply voltage node and a second power supply voltage node, and is configured to receive an input signal via an input terminal to output a first output signal having an inverted phase with respect to the input signal. A second inverter is coupled between the first power supply voltage node and the second power supply voltage node, and is configured to invert the first output signal to output a second output signal having an inverted phase with respect to the first output signal to an output terminal. A pass switch is coupled between the input terminal and the output terminal and is configured to output a signal having a level of a control voltage to the input terminal, in response to the control voltage. In other embodiments, the pass switch is configured to output a signal at the first power supply voltage to the input terminal in response to the output terminal being at the first power supply voltage and the input being in a floating state.

Bus holders for a signal on a bus according to other embodiments of the invention include a first inverter having a first inverter input and a first inverter output, wherein the bus is coupled to the first inverter input. A second inverter also is provided, including a second inverter input that is coupled to the first inverter input, and a second inverter output. A pass transistor having substantially zero threshold voltage is also provided, that includes first and second controlled electrodes (such as a source/drain) that are coupled to the second inverter output and to the first inverter input, respectively. In some embodiments, the pass transistor comprises a depletion-type NMOS transistor. In other embodiments, the pass transistor also includes a controlling electrode (such as a gate), and the first and second inverters and the controlling electrode are all coupled to a power supply voltage.

In other embodiments, a tolerant input/output buffer includes a bus holder configured to maintain an input signal so that the input signal has a level of a control voltage, and a buffer configured to transfer the input signal to a core logic. The bus holder may include a first inverter, coupled between a first power supply voltage node and a second power supply voltage node and configured to receive the input signal via an input terminal to output a first output signal having an inverted phase with respect to the input signal; a second inverter, coupled between the first power supply voltage node and the second power supply voltage node and configured to invert the first output signal to output a second output signal having an inverted phase with respect to the first output signal to an output terminal; and a pass switch, coupled between the input terminal and the output terminal and configured to output a signal having the level of the control voltage to the input terminal, in response to the control voltage. The pass switch may include a depletion-type NMOS transistor in which a first controlled electrode is coupled to the input terminal, a second controlled electrode is coupled to the output terminal, a controlling electrode is coupled to the control voltage, and a threshold voltage of which is substantially 0 volts.

In other embodiments, a tolerant input/output buffer includes a bus that carries input signals of diverse voltage levels and a bus holder that is configured to maintain a bus at a level of a control voltage in response to an input signal of any of the diverse voltage levels, notwithstanding that the input signal of any of the diverse voltage levels is withdrawn from the bus and the bus is floated. In other embodiments, the bus holder may be configured to maintain the bus at the level of the control voltage until a second input signal of any of the diverse voltage levels is carried by the bus.

In still other example embodiments, a bus holder includes a first p-type MOS transistor in which a first controlled electrode is coupled to a first power supply voltage node, a controlling electrode is coupled to an input terminal, and a second controlled electrode is coupled to a first output terminal. A first n-type MOS transistor also is provided, in which a first controlled electrode is coupled to a second power supply voltage node, a controlling electrode is coupled to the input terminal, and a second controlled electrode is coupled to the first output terminal. A second p-type MOS transistor also is provided, in which a first controlled electrode is coupled to the first power supply voltage node, a controlled electrode is coupled to the first output terminal, and a second controlled electrode is coupled to a second output terminal. A second n-type MOS transistor also is provided, in which a first controlled electrode is coupled to the second power supply voltage node, a controlling electrode is coupled to the first output terminal, and a second controlled electrode is coupled to the second output terminal. A depletion-type NMOS transistor is also provided, in which a first controlled electrode is coupled to the input terminal, a controlling electrode is coupled to a control voltage, a second controlled electrode is coupled to the second output terminal, and a threshold voltage of which is substantially 0 volts.

The bus holder may stably maintain the input signal of the bus holder using the pass switch for maintaining the input terminal at the control voltage level.

The tolerant input/output buffer may stably transfer the input signal to the core logic using the bus holder for maintaining the input terminal at the control voltage level.

DETAILED DESCRIPTION

Figure 1:
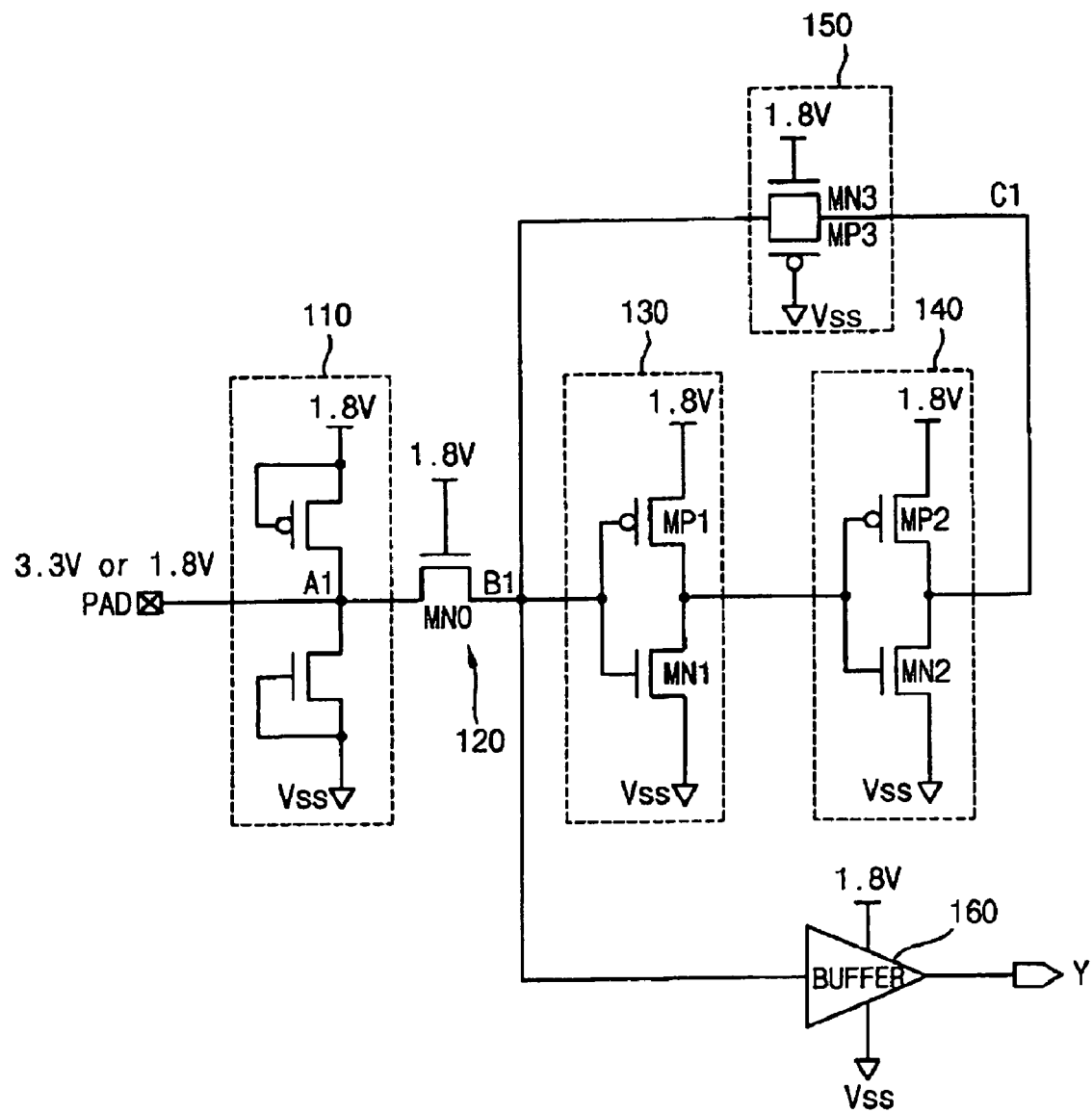
FIG. 1 is a circuit diagram illustrating a conventional tolerant input/output buffer.

Example embodiments of the present invention are disclosed herein. However, specific structural and functional details disclosed herein are merely representative for purposes of describing example embodiments of the present invention; however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, example embodiments of the present invention will be described in detail with reference to the accompanying drawings. The embodiments will be explained in detail for enabling one of ordinary skill in the art to execute the present invention.

Figure 3:
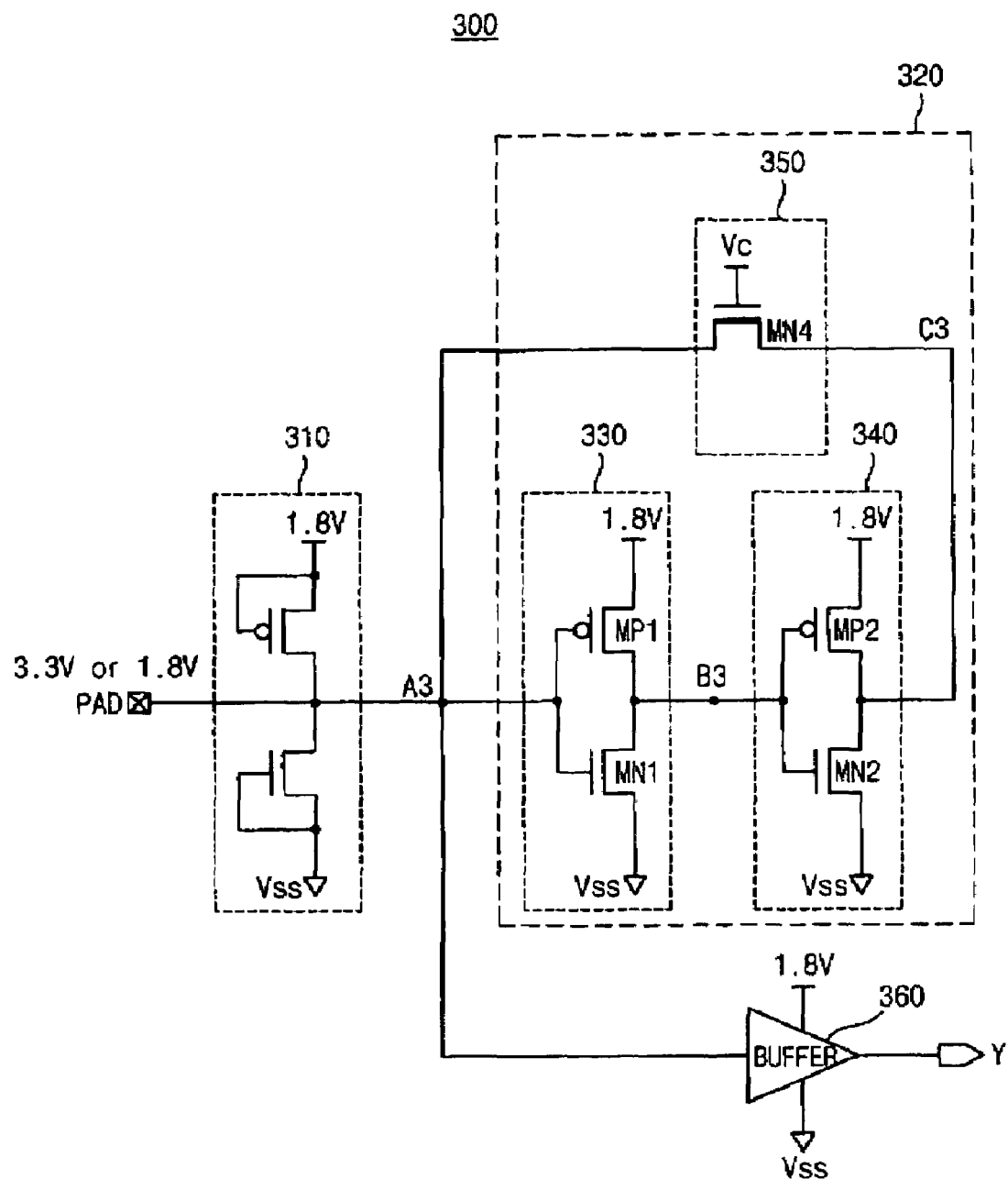
FIG. 3 is a circuit diagram illustrating a tolerant input/output buffer according to an example embodiment of the present invention.

FIG. 3 is a circuit diagram illustrating a tolerant input/output buffer according to an example embodiment of the present invention.

Referring to FIG. 3, the tolerant input/output buffer 300 may include a PAD, an electrostatic discharge protection circuit 310, a bus holder 320, and a buffer 360.

Particularly, the PAD receives an input signal, the bus holder 320 maintains the input signal to a voltage level of a control voltage Vc, and the buffer 360 receives the input signal and transfers the input signal to a core logic (connected at Y).

The electrostatic discharge protection circuit 310 protects the core logic by preventing an over-voltage, due to static electricity, from being transferred toward the core logic, when the over-voltage is applied-through the PAD as the input signal.

The bus holder 320 may include a first inverter 330, a second inverter 340, and a pass switch 350. The first inverter 330 receives the input signal through a first input terminal A3, and outputs a first output signal having an inverted phase with respect to the input signal. The second inverter 340 receives the first output signal through a second input terminal B3, and outputs a second output signal, having an inverted phase with respect to the first output signal, to a second output terminal C3. The pass switch 350 is connected between the first input terminal A3 and the second output terminal C3 to output a control voltage Vc. In some embodiments, the pass switch 350 may be implemented with a depletion-type NMOS transistor MN4 a gate of which is connected to the control voltage Vc and a threshold voltage of which is 0 volts.

When an input signal of 3.3 volts is received through the PAD, an initial voltage level of the first input terminal A3 is 3.3 volts. The input signal of 3.3 volts is input to the buffer 360. Even though the buffer 360 is a device having a Schmidt trigger characteristic, an abnormal operation may not occur because 3.3 volts of the input signal is generally much higher than a threshold voltage (a power supply voltage/2 level (i.e., 0.9 V)) of the Schmidt trigger. A second output signal of the second output terminal C3 is maintained at a power supply voltage level of 1.8 volts. When the PAD is floated, the voltage level of the first input terminal A3, which supplies the input signal to the buffer 360, is gradually lowered, and then is maintained at the power supply voltage of 1.8 volts by the bus holder 320. More particularly, in the floated state the voltage of the first input terminal A3 is reduced due to an effect of a leakage current. The second output signal is maintained at the power supply voltage level of 1.8 volts by the first inverter 330 and the second inverter 340, and the pass switch 350, which receives the second output signal and outputs the received second output signal to the first input terminal A3. In this case, since the pass switch 350 is implemented with the n-type MOS transistor MN4, an output signal of the pass switch 350 has a voltage level of (the control voltage Vc—the threshold voltage of the transistor MN4). Since the threshold voltage of the pass switch 350 is 0 volts, the output signal of the pass switch 350 has a voltage level of up to the control voltage (i.e., 1.8 volts), and the first input terminal A3 has the voltage level of up to the control voltage. Accordingly; even though the PAD is-floated, the first input terminal A3 may stably maintain a previous voltage state (or logic state) of the input signal until a new input signal is input.

When the input signal of 1.8 volts is received through the PAD, an initial voltage level of the first input terminal A3 is 1.8 volts, and the input signal is input to the buffer 360. Even though the buffer 360 is a device having the Schmidt trigger characteristic, an abnormal operation may not occur because the 1.8-volt input signal of the buffer 360,is generally much higher than the threshold voltage (the power supply voltage/2 (i.e., 0.9V)) of the Schmidt trigger. In this case, the second output signal of the second output terminal C3 is maintained at the power supply voltage level of 1.8 volts. When the PAD is floated, the second output terminal C3 is maintained at the power supply voltage level of 1.8 volts by the first inverter 330 and the second inverter 340, and the pass switch 350 receives the second output signal and outputs the received second output signal to the first input terminal A3. At this time, since the pass switch 350 is implemented with the NMOS transistor, the threshold voltage of which is 0 volts and the control voltage Vc connected to the gate has the same level as the power supply voltage, the power supply voltage level 1.8 volts is output to the first input terminal A3. Accordingly, even though the PAD is floated, the first input terminal A3 may stably maintain the previous voltage state (or logic state) of the input signal until the new input signal is input, thereby being capable of maintaining a normal operation of the tolerant input/output buffer 300.

Figure 4:
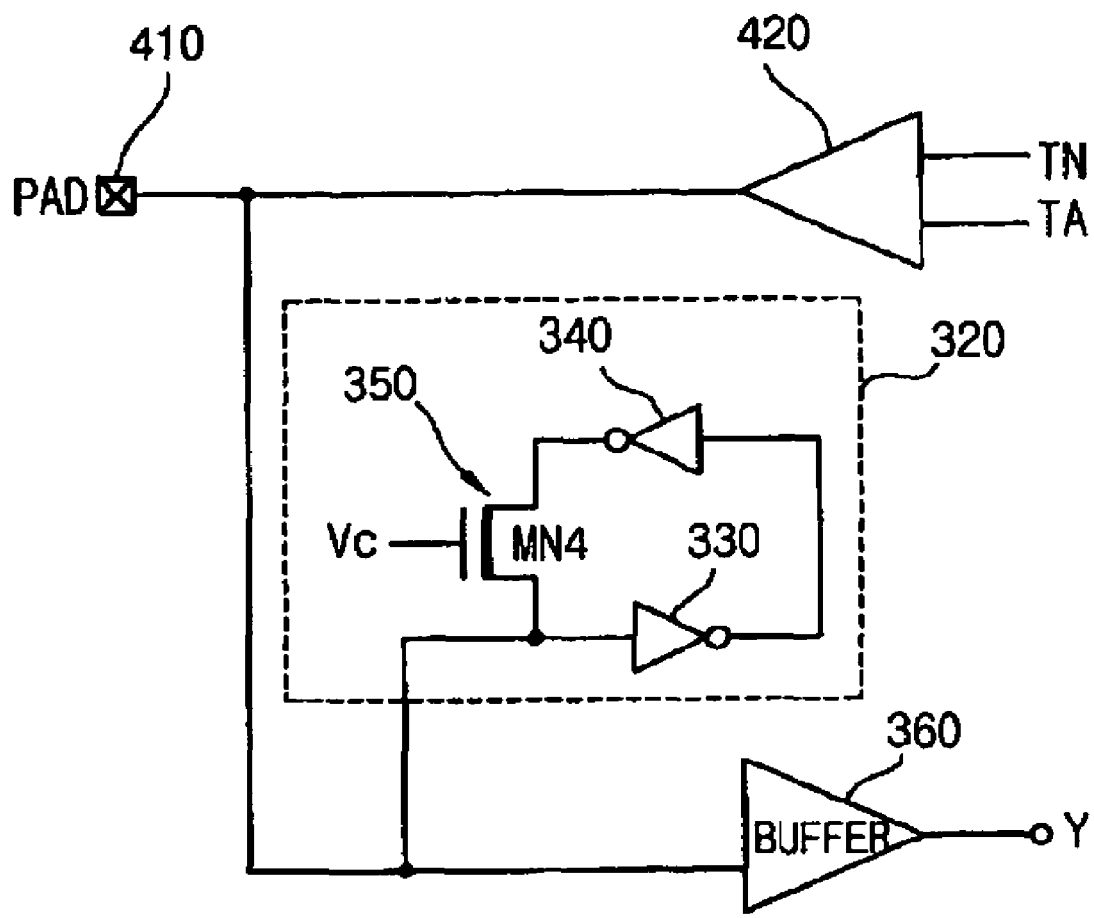
FIG. 4 is a circuit diagram illustrating a test circuit for a tolerant input/output buffer according to an example embodiment of the present invention.
Figure 5:
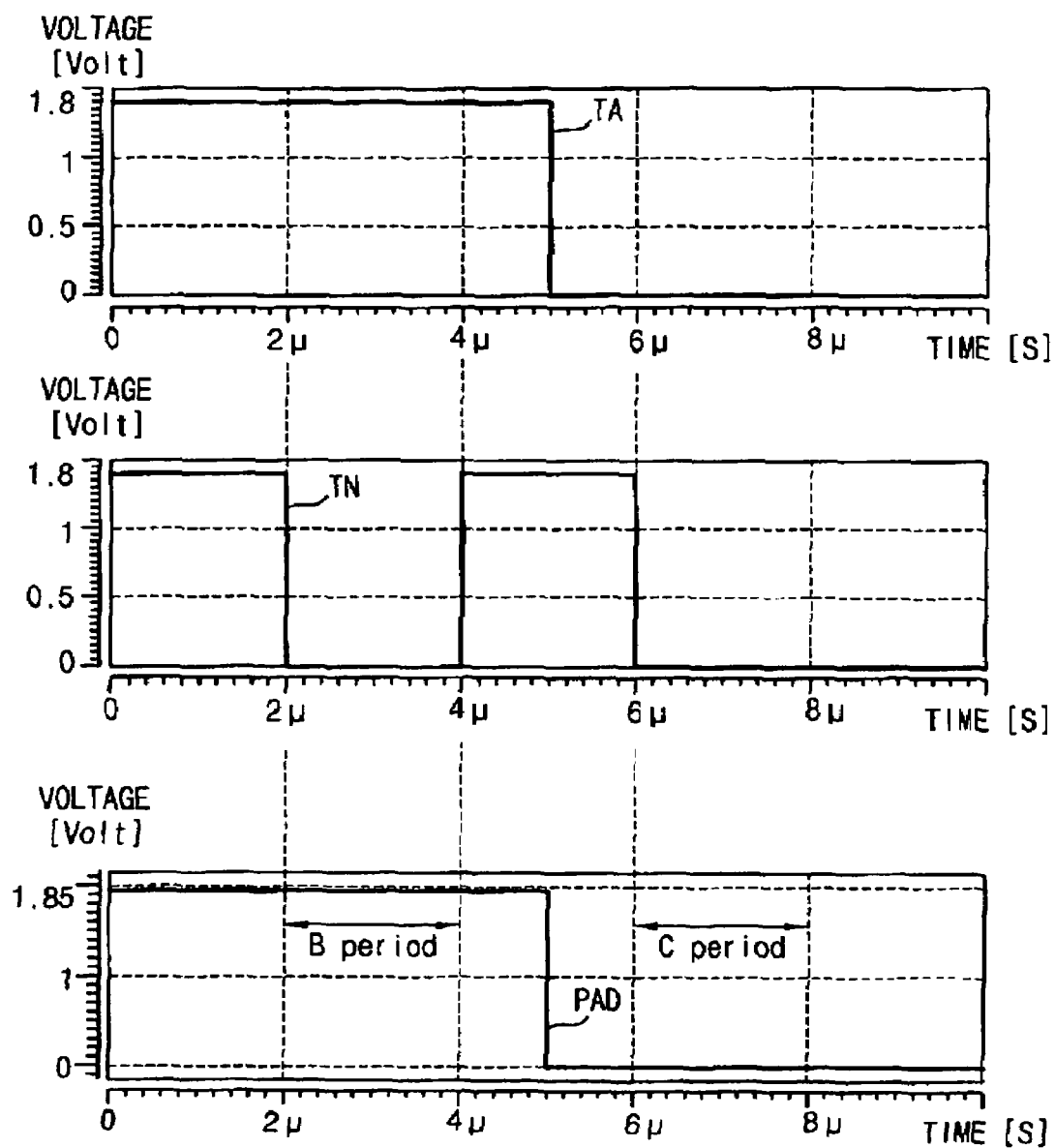
FIG. 5 graphically illustrates waveforms of signals at terminals of the test circuit shown in FIG. 4.
Figure 6:
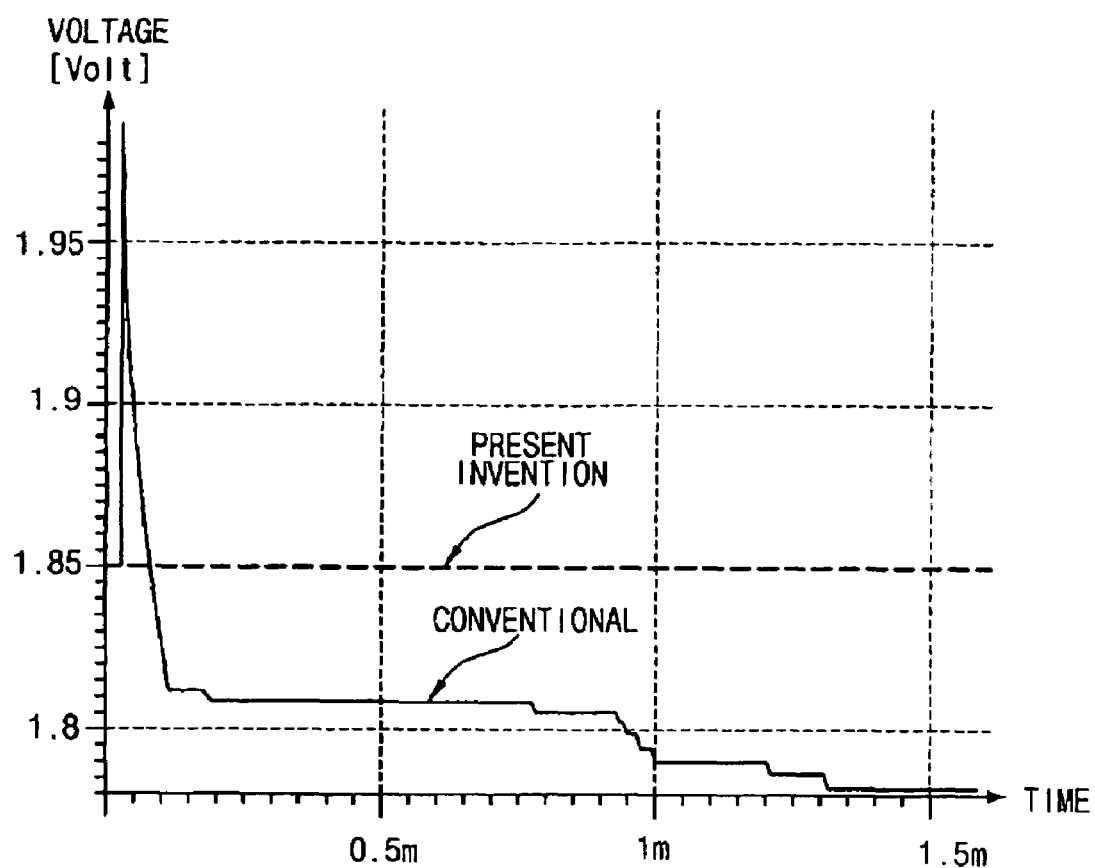
FIG. 6 graphically illustrates a test result of the test circuit shown in FIG. 4.

FIG. 4 is a circuit diagram illustrating a test circuit for a tolerant input/output buffer according to an example embodiment of the present invention. FIG. 5 graphically illustrates waveforms for signals at each of the terminals of the test circuit shown in FIG. 4. FIG. 6 graphically illustrates a test result of the test circuit shown in FIG. 4.

An operation of the tolerant input/output buffer will be explained with reference to FIGS. 4, 5 and 6.

The test circuit 400 of the tolerant input/output buffer includes a controller 420 that may apply the input signal to the PAD. The controller 420 receives a test input signal TA and applies an input signal (e.g., 1.85V) to the PAD when a control signal TN is a high state, and does not apply the input signal to the PAD when the control signal TN is a low state. In other words, according to the control signal TN, the PAD applies the input signal or the PAD is floated. The test circuit 400 will be now explained with reference to waveforms as shown in FIG. 5. When the control signal TN is high (0<t<2 μs), the controller 420 receives the test input signal TA of the high state and applies 1.85 volts as the input signal to the PAD. Then, when the control signal TN is changed to the low state (t=2 μs), the PAD becomes a floating state because the controller 420 does not output the input signal to the PAD. However, the input signal of the PAD maintains the previous state of 1.85 volts (B period) until a new input signal is input by the bus holder 320. When the control signal TN again becomes the high state (4 μs<t<6 μs), a state of the test input signal TA is transferred as the input signal of the PAD, and the input signal is changed to the low state (i.e., 0 volts) from the high state (i.e., 1.85 volts). Then, when the control signal TN becomes the low state (t=6 μs), the PAD again becomes the floating state, but the low state of 0 volts is stably maintained using the bus holder 320 (C period). The tolerant input/output buffer may stably maintain the previous voltage state (or logic state) using the bus holder 320 until a new input signal is input when the PAD is floated.

FIG. 6 shows voltage variation at a PAD when the control signal TN is a low state and a previous input signal is a high state, as shown in FIG. 5.

Figure 2:
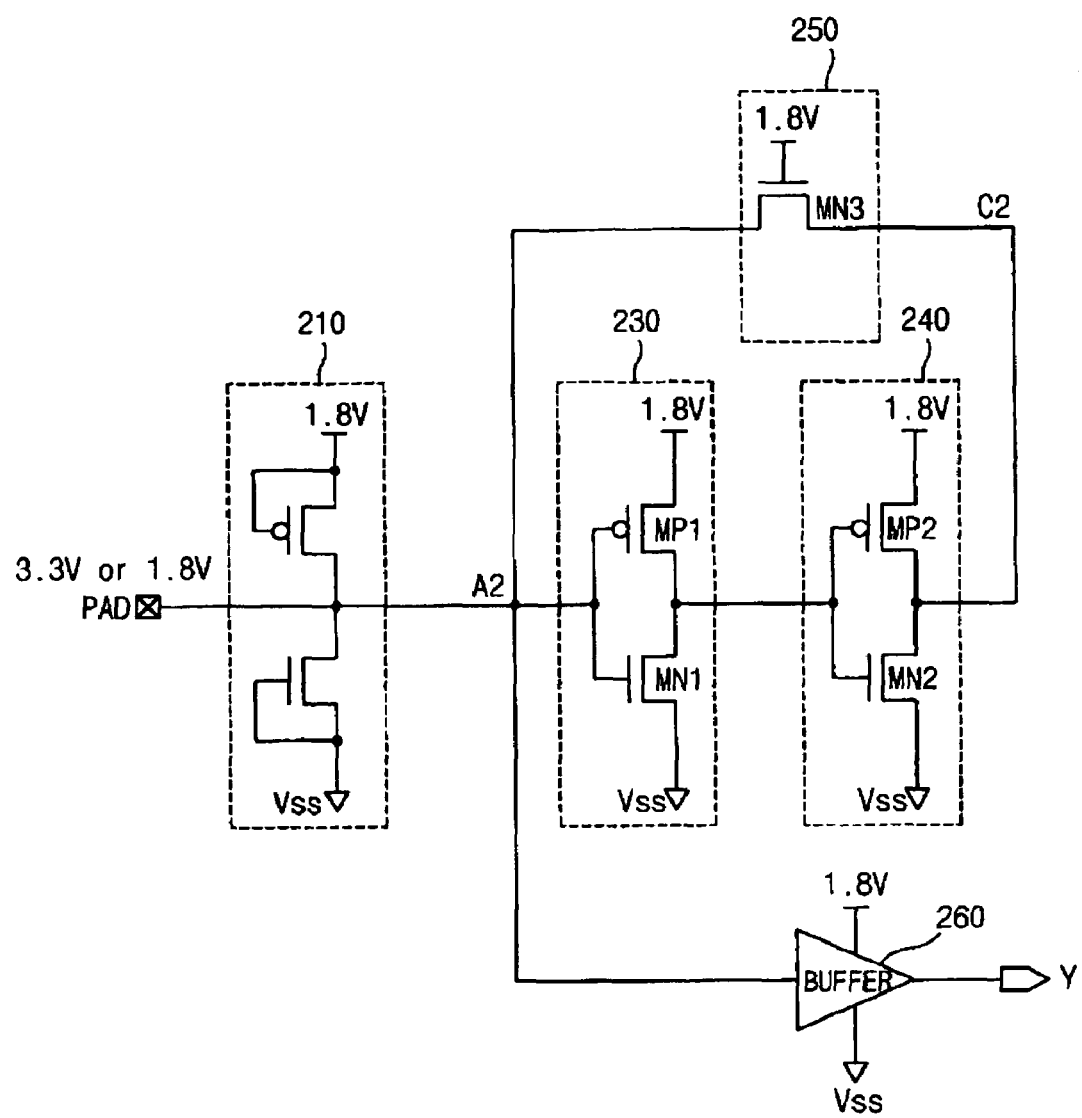
FIG. 2 is a circuit diagram illustrating another conventional tolerant input/output buffer.

When a conventional tolerant input/output buffer of FIG. 2 is used, the voltage of the PAD is gradually decreased from 1.8 volts because the input signal at node A2 has a voltage level of (the power supply voltage—the threshold voltage of MN3). However, since the threshold voltage of MN4 in the tolerant input/output buffer according to some embodiments of the present invention is substantially 0 volts, the input signal at node A2 in the tolerant input/output buffer may have up to the power supply voltage level, and thus the PAD may continuously maintain the power supply of 1.85 volts.

As described above, a bus holder according to some embodiments of the present invention uses the depletion-type NMOS transistor having the threshold voltage of substantially 0 volts as the pass switch, and may stably maintain the previous voltage state (or logic state) of the input signal at the PAD until the new input signal is input to the PAD when the input terminal is floated.

Additionally, a tolerant input/output circuit according to some embodiments of the present invention uses the bus holder which may stably maintain the previous voltage state (or logic state) of the input signal until the new input signal is input when the PAD is floated, does not use the pass transistor that reduces the voltage level of the input signal, and thus may reduce the possibility of the abnormal operation of the tolerant input/output buffer.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A tolerant input/output buffer comprising:
   a bus that carries input signals of diverse logic HIGH voltage levels; and a bus holder that maintains the bus at a same voltage as a control voltage in response to an input signal of any of the diverse logic HIGH voltage levels, notwithstanding that the input signal of any of the diverse logic HIGH voltage levels is withdrawn from the bus and the bus is floated.

2. A tolerant input/output buffer of claim 1 wherein the input signal of any of the diverse logic HIGH voltage levels is a first input signal of any of the diverse logic HIGH voltage levels and wherein the bus holder is maintains the bus at the same voltage as the control voltage in response to the first input signal of any of the diverse logic HIGH voltage levels until a second input signal of any of the diverse logic HIGH voltage levels is carried by the bus, and notwithstanding that the first input signal of any of the diverse logic HIGH voltage levels is withdrawn from the bus and the bus is floated.

3. The tolerant input/output buffer of claim 1, wherein the bus holder comprises:
a first inverter, coupled between a first power supply voltage node and a second power supply voltage node, that receives the input signals of diverse logic HIGH voltage levels from the bus via an input terminal and outputs a first output signal having an inverted phase with respect to the input signals of diverse logic HIGH voltage levels;
a second inverter, coupled between the first power supply voltage node and the second power supply voltage node that inverts the first output signal and outputs a second output signal having an inverted phase with respect to the first output signal to an output terminal; and
a pass switch, coupled between the input terminal and the output terminal that outputs a signal having a same voltage as a control voltage to the input terminal, in response to the control voltage.

4. The tolerant input/output buffer of claim 3, wherein the pass switch includes a depletion-type NMOS transistor in which a first controlled electrode is coupled to the input terminal, a second controlled electrode is coupled to the output terminal, a controlling electrode is coupled to the control voltage, and a threshold voltage of which is substantially 0 volts.

5. The tolerant input/output buffer of claim 4, wherein the control voltage has substantially the same level as that of the first power supply voltage.

6. The tolerant input/output buffer of claim 5, wherein the first inverter and the second inverter are complementary metal-oxide semiconductor (CMOS) inverters.

7. The tolerant input/output buffer of claim 1, wherein the bus holder comprises:
a first p-type MOS transistor in which a first controlled electrode is coupled to a first power supply voltage node, a controlling electrode is coupled to an input terminal that receives the input signals of diverse logic HIGH voltage levels from the bus, and a second controlled electrode is coupled to a first output terminal;
a first n-type MOS transistor in which a first controlled electrode is coupled to a second power supply voltage node, a controlling electrode is coupled to the input terminal that receives the input signals of diverse logic HIGH voltage levels from the bus, and a second controlled electrode is coupled to the first output terminal;
a second p-type MOS transistor in which a first controlled electrode is coupled to the first power supply voltage node, a controlling electrode is coupled to the first output terminal, and a second controlled electrode is coupled to a second output terminal;
a second n-type MOS transistor in which a first controlled electrode is coupled to the second power supply voltage node, a controlling electrode is coupled to the first output terminal that receives the input signals of diverse logic HIGH voltage levels from the bus, and a second controlled electrode is coupled to the second output terminal; and
a depletion-type NMOS transistor in which a first controlled electrode is coupled to the input terminal, a controlling electrode is coupled to a control voltage, a second controlled electrode is coupled to the second output terminal, and a threshold voltage of which is substantially 0 volts.

8. The tolerant input/output buffer of claim 7, wherein the first power supply voltage has substantially the same level as that of the control voltage.

9. The tolerant input/output buffer of claim 8, wherein the depletion-type NMOS transistor outputs a signal having a level of the control voltage to the input terminal that receives the input signals of diverse logic HIGH voltage levels from the bus, in response to the control voltage.

10. The tolerant input/output buffer of claim 1, wherein the bus holder comprises:
a first inverter including a first inverter input and a first inverter output, wherein the bus that carries the input signals of diverse logic HIGH voltage levels is coupled to the first inverter input;
a second inverter including a second inverter input that is coupled to the first inverter output, and a second inverter output; and
a pass transistor having substantially zero threshold voltage and including a first controlled electrode and a second controlled electrode that are coupled to the second inverter output and to the first inverter input, respectively.

11. A tolerant input/output buffer of claim 10 wherein the pass transistor comprises a depletion-type NMOS transistor.

12. A tolerant input/output buffer of claim 11 wherein the pass transistor also includes a controlling electrode and wherein the first inverter and the second inverter and the controlling electrode are all coupled to a power supply voltage.

* * * * *